United States Patent

Canada et al.

[11] Patent Number: 6,138,078
[45] Date of Patent: *Oct. 24, 2000

[54] MACHINE MONITOR WITH TETHERED SENSORS

[75] Inventors: Ronald G. Canada, Knoxville; Eugene F. Pardue, Lenoir City; James C. Robinson, Knoxville, all of Tenn.

[73] Assignee: CSI Technology, Inc., Del.

[*] Notice: This patent is subject to a terminal disclaimer.

[21] Appl. No.: 09/104,688

[22] Filed: Jun. 25, 1998

Related U.S. Application Data

[63] Continuation-in-part of application No. 08/915,069, Aug. 20, 1997, Pat. No. 5,852,351, which is a continuation-in-part of application No. 08/697,335, Aug. 22, 1996, Pat. No. 5,726,911.

[51] Int. Cl.[7] .............................. G06F 15/00; H02H 7/08
[52] U.S. Cl. .............................. 702/44; 702/56; 702/189; 318/490
[58] Field of Search ................................ 702/32–33, 44, 702/56, 182, 189; 318/434, 471, 490

[56] References Cited

U.S. PATENT DOCUMENTS

| | | | |
|---|---|---|---|
| 3,965,669 | 6/1976 | Larson et al. | 368/5 |
| 4,194,178 | 3/1980 | Dumbeck | 340/201 R |
| 4,258,421 | 3/1981 | Juhasz et al. | 364/424 |
| 4,495,448 | 1/1985 | Dumbeck | 318/54 |
| 4,525,763 | 6/1985 | Hardy et al. | 361/24 |
| 4,575,803 | 3/1986 | Moore | 364/551 |
| 4,659,976 | 4/1987 | Johanson | 318/332 |
| 4,823,067 | 4/1989 | Weber | 318/799 |
| 4,839,830 | 6/1989 | Amey et al. | 364/551.01 |
| 5,019,760 | 5/1991 | Chu et al. | 318/490 |
| 5,189,350 | 2/1993 | Mallett | 318/434 |
| 5,323,325 | 6/1994 | Izumiya | 364/474.16 |
| 5,450,321 | 9/1995 | Crane | 364/424.04 |
| 5,473,229 | 12/1995 | Archer et al. | 318/254 |
| 5,554,900 | 9/1996 | Pop, Sr. | 310/156 |
| 5,726,911 | 3/1998 | Canada et al. | 702/32 |
| 5,852,351 | 12/1998 | Canada et al. | 702/56 |
| 5,907,491 | 5/1999 | Canada et al. | 702/182 |

FOREIGN PATENT DOCUMENTS 2681942  4/1992  France .
2673777  9/1992  France .

*Primary Examiner*—Marc S. Hoff
*Assistant Examiner*—Bryan Bui
*Attorney, Agent, or Firm*—Luedeka, Neely & Graham, P.C.

[57] ABSTRACT

A monitor attaches to a mount proximate a machine to determine the health operating history and operating status of the machine. The monitor is preferably self-contained, having its own internal power source, electronics, and sensor suite. If desired, the monitor may be powered by an external power source. One or more internal sensors disposed in the monitor are provided to sense machine operating parameters such as temperature, flux, and vibration. External sensors tethered to the monitor may be positioned at varying points on and/or in the machine. Monitor electronics process sensor outputs to determine machine operating parameters such as machine speed and load. Monitor electronics are also operable to transform time domain data generated by the sensors to frequency domain data. A communications port enables a peripheral device, such as a notebook computer or a computer network, to communicate with the monitor and download stored data. Downloaded data can be further analyzed and statistically compared with trend data at a base computer to further ascertain the health and condition of the machine.

25 Claims, 9 Drawing Sheets

MACHINE MONITOR WITH TETHERED SENSORS

This is a continuation-in-part of application Ser. No. 08/915,069, filed Aug. 20, 1997, which issued as U.S. Pat. No. 5,852,351 which is a continuation-in-part of application Ser. No. 08/697,335, filed Aug. 22, 1996, which issued as U.S. Pat. No. 5,726,911.

TECHNICAL FIELD

The present invention relates generally to machine monitors. More particularly, the present invention relates to a machine monitor capable of being interfaced with a computer network and further capable of having one or more external machine sensors tethered to the monitor.

BACKGROUND

Electric motors, particularly ac induction motors, are employed in many industrial and manufacturing facilities. Among their many applications, ac induction motors are used to provide power to machinery in manufacturing facilities. Downtime caused by a failure of an electric motor reduces productivity and profitability. Electric motors, therefore, are important elements of industrial facilities and their health and condition must be closely observed to prevent motor failures that result in costly unscheduled downtime.

Evaluating the extent of stator wire insulation degradation has long been considered an effective way of determining the condition of an electric motor. As the motor ages, insulation breakdown occurs due to high motor temperature and other operating stresses. When insulation degradation reaches a critical point, the motor windings short circuit, thereby resulting in motor failure.

Attempts have been made in the art to provide electric motor monitoring systems capable of monitoring the condition of the motor. Many of these systems focus on determining the amount of insulation degradation as a way of predicting the remaining useful life of the motor. For example, in U.S. Pat. No. 5,019,760 to Chu et al., a system is disclosed for continuously determining the consumed life of electrical motor winding insulation. Insulation degradation is calculated as a function of insulation thermal properties, insulation temperature, and motor power rating. The temperature of the insulation is measured over a time interval, and the average winding temperature is used to calculate a consumed life of the insulation for that time interval. The consumed life values calculated for each time interval are then summed to determine a total consumed life of the motor.

In U.S. Pat. No. 5,189,350 to Mallett, there is described a monitoring system for an electric motor. A temperature sensor monitors the operating temperature of the motor. A memory is provided for storing the "absolute maximum operating temperature" and a "predetermined maximum permitted operating temperature" of the motor. An indicator is used for indicating the sensed motor temperature as lying within either a safe, hazardous, or dangerous range as determined by comparison of the sensed motor temperature to the stored maximums. A recorder stores the number of times the motor has operated beyond the predetermined maximum permitted operating temperature and the number of times the motor has operated beyond the absolute maximum operating temperature.

In U.S. Pat. No. 4,525,763 to Hardy et al., a system for predicting the remaining useful life of an electric motor is described. Hardy utilizes motor temperature and past history to determine the amount of insulation degradation, which forms the basis of the remaining useful life prediction. The predicted remaining useful life is displayed and may be used to issue a warning or to trip circuit breakers supplying power to the motor when projected life is shorter than predicted life.

While high motor temperature, and resultant insulation degradation can contribute to electric motor failures, it is not the only factor. There are many complex and interrelated operating parameters of electric motors that affect the health and longevity of the motor. Factors such as motor speed, loading, vibration, and the number of motor starts/stops also affect motor life. However, all known electric motor monitors today are incapable of monitoring these operating parameters in an efficient, productive manner.

Known prior art devices do not adequately address multiple contributing factors to motor failure, maintenance issues for an electric motor monitoring system itself, enhancing the useability of a monitoring system, or providing a monitoring system that can be applied in a cost effective manner.

What is needed, therefore, is an electric motor monitor capable of sensing and analyzing various stresses experienced by the motor during the life of the motor, including temperature, and storing these data as the operation history of the motor. The monitor should be configured to allow stored data to be easily downloaded for archival or further analysis. For purposes of maintainability and affordability, the monitor should be relatively small and self-contained and capable of being mounted directly to or adjacent the motor. Finally, with the monitor mounted directly to the motor, it should be rugged and capable of withstanding the rigors of a harsh industrial environment.

SUMMARY

With regard to the foregoing and other objects, the present invention is directed toward a machine monitor that attaches to a mount proximate an electric motor which drives a piece of driven equipment. Alternatively, the monitor may be attached to a mount adjacent the driven equipment. The monitor functions to monitor operation of the motor or the driven equipment, or both, and produces an operation history of the monitored equipment. The monitor includes a structural enclosure with an engagement surface. A fastener, such as an epoxy adhesive or a threaded bolt, is used to attach the engagement surface to the mount. At least one internal sensor disposed in the structural enclosure senses one or more operating parameters of the motor, such as motor speed and motor load, and produces internal sensor signals corresponding to the one or more internally sensed operating parameters. At least one external sensor disposed external to the structural enclosure senses one or more operating parameters of the motor or the driven equipment, or both, and produces external sensor signals corresponding to the one or more externally sensed operating parameters. A signal processor disposed in the enclosure receives and processes internal and external sensor signals and produces data corresponding to the sensed operating parameters. Also disposed in the enclosure is memory for storing data corresponding to the sensed operating parameters where the stored data includes data corresponding to the operation history of the motor or the driven equipment, or both. A communications port, such as a wireless IR data link, RF data link, or a computer network communications module, enables the monitor to communicate with a peripheral device.

The signal processor may be further operational to perform a fast Fourier transform (FFT) of internal sensor signals to produce data corresponding to the sensed operating parameters. Likewise, the signal processor may be operational to perform an FFT of external sensor signals.

As stated above, at least one external sensor is disposed external to the monitor's structural enclosure. An external sensor may be attached to the motor, the driven equipment or both. For example, an external vibration transducer may be attached to the outer surface of the driven equipment at a point where vibration can be easily detected by the transducer. In similar fashion, an external flux sensor may be attached to the outer casing of the motor to sense flux produced by the motor. External sensors may also be positioned within the motor and/or the driven equipment. For example, a resistance temperature detector (RTD) wound in with the stator wires of the motor may be used to sense the temperature of the motor windings. Each of these types of external sensors are employed to provide sensor data additional to that obtained by the monitor's internal sensors.

The invention also provides a system for monitoring the operating condition of one or more machines, such as an ac induction motor. For each machine, the system includes at least monitor which is attached to the machine. The monitor is similar to that described above except external sensors need not be employed. The monitor senses and stores at least one operating parameter of the machine. Over time, the stored operating parameter(s) become the operation history of the machine. The system also includes a computer network connected to each monitor for downloading the stored operation history of each machine monitored with the system. When several monitors are employed in the system, a communications hub is preferably employed to interface each of the monitors with the computer network.

The present invention also provides a method of monitoring one or more machines which generate machine operating parameters, such as vibration, temperature, and flux. The method includes the steps of attaching a machine monitor adjacent each of the one or more machines. Each monitor produces sensor signals representing a machine operating parameter generated by the machine. The monitor processes the sensor signals over time to produce a life history of the operating parameter for the machine. The life history is then stored in the monitor and transferred to a computer network connected to the monitor.

BRIEF DESCRIPTION OF THE DRAWINGS

The preferred embodiments of the invention will now be described in further detail with reference to the drawings wherein like reference characters designate like or similar elements throughout the several drawings as follows.

DETAILED DESCRIPTION OF PREFERRED EMBODIMENTS

Figure 1:
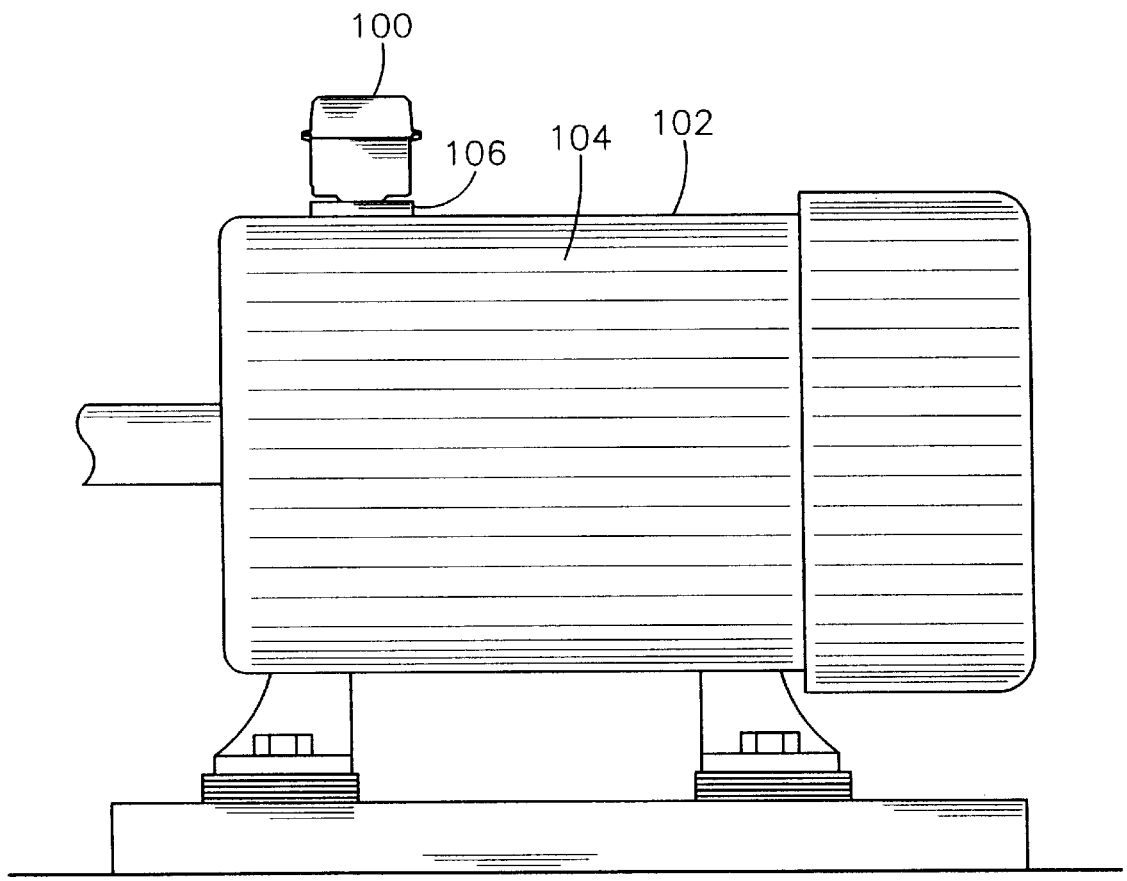
FIG. 1 is a side view of an ac induction motor with a monitor of the present invention attached to the motor by means of a mounting plate.

In accordance with a preferred embodiment of the present invention shown in FIG. 1, a motor monitor 100 capable of sensing, analyzing, storing, and outputting various motor operating data is attached externally to the frame 104 of a large industrial electrical machine, such as an ac induction motor 102. Alternately, the monitor 100 may be attached to an ac generator for sensing and recording various life history parameters of the generator. The monitor 100, which is fully self-contained in sensors, data acquisition, and power, is small in comparison to the size of the motor 102 and mounted so as not to interfere with the operation of the motor.

Figure 2:
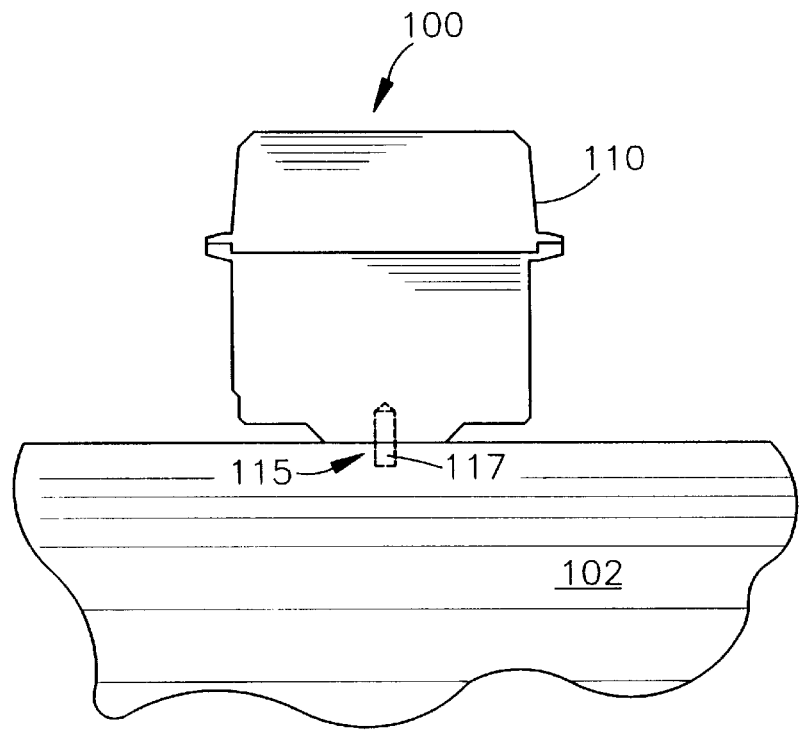
FIG. 2 is a sectional view of an electric motor monitor attached to an electric motor by means of a bolt threaded into the lifting eye bolt hole of the motor.

In order to provide consistent, reliable motor operating data, the monitor 100 should be capable of withstanding the environmental conditions typically experienced by an electric motor 102, including mechanical shock, temperature, and contamination from such materials as oil and water. As shown in FIG. 2, the monitor 100 consists of a ruggedized housing 110 capable of withstanding the typically harsh environments of industrial facilities. Electronics and sensors within the monitor 100 are sealed and protected by the housing 110 so that the monitor 100 may be mounted in exterior and wet environments.

Figure 3:
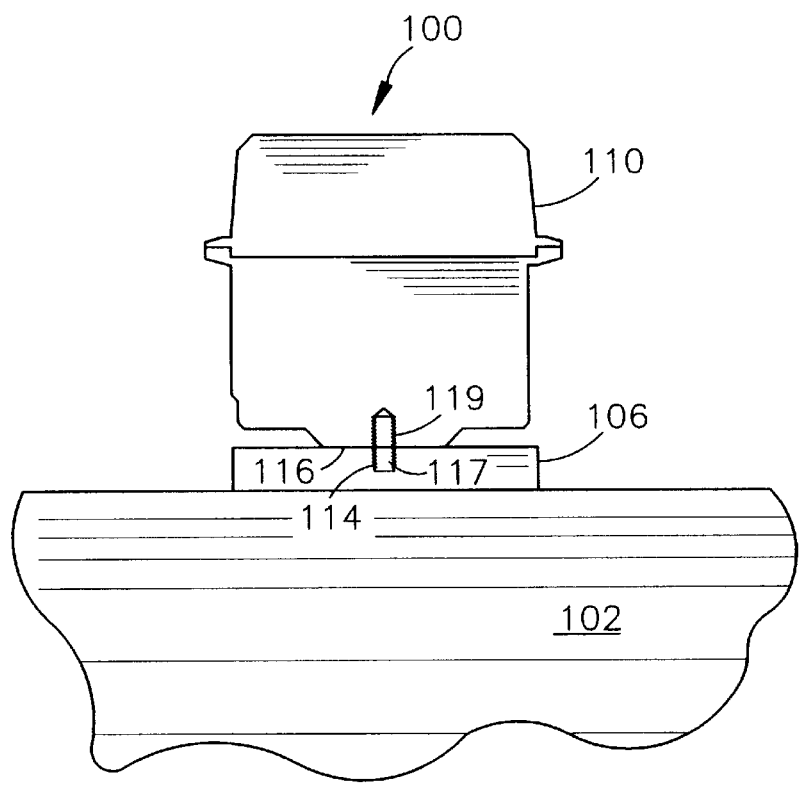
FIG. 3 is a sectional view of the motor monitor and mounting plate of FIG. 1.

Although the monitor 100 may be attached by any suitable attachment means, including bolts, screws, rivets, quick release fasteners, welding, adhesives, and magnets, a preferred means of attaching the monitor 100 to the motor is shown in FIG. 1. A mounting plate 106 is secured to the motor frame 104 by bolts (not shown). Alternatively, the mounting plate 106 is attached to the frame 104 by an epoxy adhesive. As FIG. 3 illustrates, the mounting plate 106 includes a threaded recess 114 into which a threaded stud 117 is positioned. The stud 117 is of sufficient length to protrude above the plate 106 as shown. At the base of the monitor 100 is an engagement surface 116 that includes a threaded recess 119 sized to receive the stud 117. After mounting plate 106 is attached to the motor and the stud 117 positioned within recess 114, the monitor 100 is then threaded onto that portion of stud 117 that protrudes above the mounting plate 106 so that the engagement surface 116 contacts the mounting plate 106. Thus, the monitor 100 attaches to a mount proximate the motor 102.

Referring again to FIG. 2, an alternate means of attaching the monitor 100 to the motor 102 is illustrated. The mounting plate 106 is eliminated in FIG. 2 and stud 117 is instead threaded into an existing motor lifting eye bolt hole, shown generally at 115. For the attachment methods illustrated in FIGS. 2 and 3, attachment of the monitor 100 to the motor 102 can be accomplished by hand. No tools are needed. This means for attaching the monitor 100 to the motor 102 is also characterized as attachment of the monitor 100 to a mount proximate the motor 102 where the mount includes that area of the motor frame 104 to which the monitor 100 attaches. Additionally, a mount proximate the motor 102 may include structure which is not part of the motor 102 and is not attached to the motor 102 yet positions the monitor 100 such that the monitor 100 is in sensory contact with the motor 102.

The monitor 100 may be conceptually viewed as a device that provides a function somewhat similar to the function provided by the odometer of an automobile. An automobile odometer provides the operator with information relating to how many total miles the vehicle has been driven. The mileage indicated by the odometer is used by the operator, and others, as a single measure of the general health and condition of the automobile. Preventive maintenance, component life, and even the worth of an automobile are usually established by this single parameter (i.e., mileage). Because of the complexity and interrelationship of factors that effect the condition of electric motors, the health of an electric motor generally cannot be determined by a single parameter. For example, the following factors have been determined to affect the life of an electric motor:

1. Total run time (in hours);
2. Run time at various motor loading conditions;
3. Motor temperature;
4. Ambient temperature;
5. Number of starts and stops;
6. Motor vibration;
7. Balance and alignment of the motor;
8. Temperature history of the windings; and
9. Efficiency of the motor.

In a preferred embodiment, the monitor 100 of the present invention senses, collects, analyzes, and stores information useful for ascertaining the health and condition of electric motors based on these factors. Although it is preferable to incorporate within the monitor 100 the capability to analyze sensor data, such as by Fourier transform or preferably by fast Fourier transform (FFT), it is not required. If desired, the monitor 100 may be used simply as a device that senses and stores various operating parameters with little or no analysis of the data performed within the monitor 100 itself. The stored sensor data could be downloaded to a base computer for analysis and archival.

Figure 4:
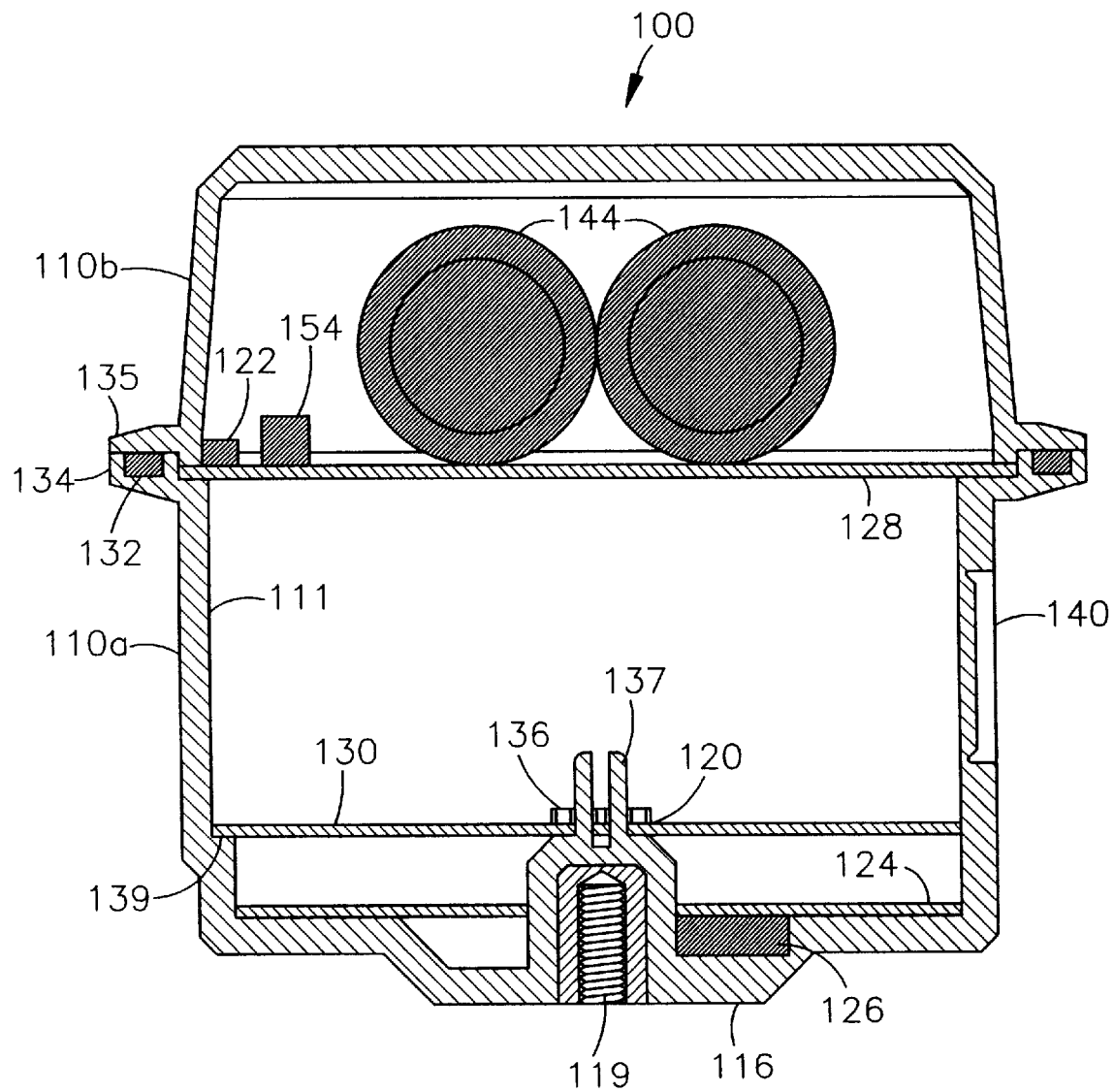
FIG. 4 is a cross-sectional view of the monitor of FIGS. 1 and 2.

As illustrated in the cross-sectional view of FIG. 4, the housing 110 of the monitor consists of a bucket 110a that is covered by lid 110b. At the top of the bucket 110a is an annular flange 134 which joins with a corresponding annular flange 135 formed at the bottom of the lid 110b. The bucket 110a and lid 110b are secured to each other by one or more clamps (not shown) which hold flanges 134, 135 in compression. Set within a channel formed in flange 134 is a rubber O-ring 132 to prevent intrusion of moisture and other contaminants at the interface of flanges 134, 135.

Figure 5:
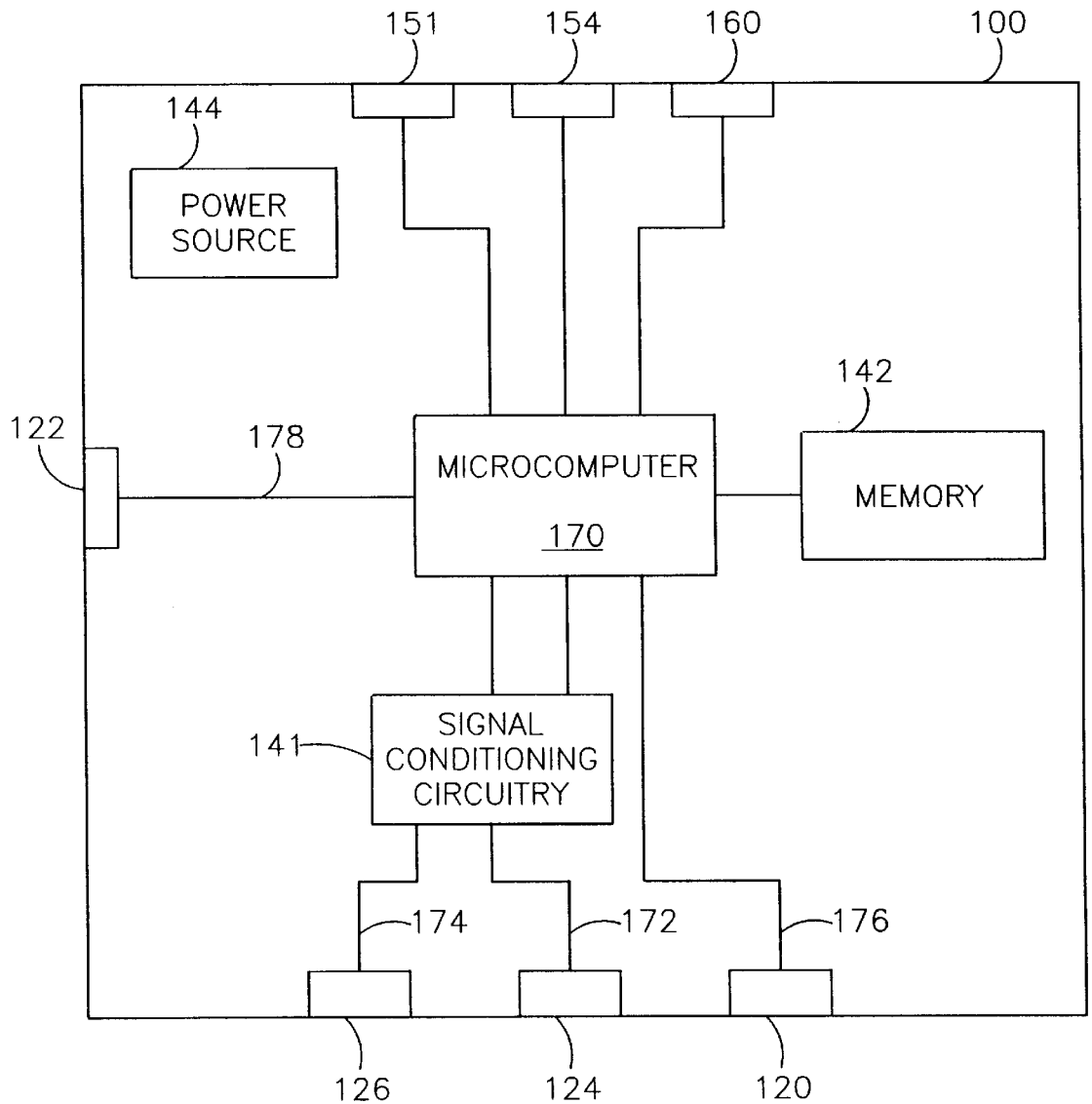
FIG. 5 is a functional block diagram of a preferred embodiment of monitor electronics and sensors.

As can be seen in FIG. 4, the engagement surface 116 extends beyond the base of the bucket 110a to elevate the monitor 100 and help reduce thermal conductivity between the motor 102 and monitor 100. As FIG. 4 illustrates, and with further reference to the functional block diagram of FIG. 5, sensors within the monitor 100 are preferably mounted at or near the engagement surface 116 at the base of the monitor 100. When the monitor 100 is threaded into the eye bolt hole 115 (FIG. 2) or mounting plate 106 (FIGS. 1 and 3), the sensors establish contact with the motor frame 104 through the engagement surface 116 so that temperature, flux, and vibrations produced by the motor 102 can be detected more readily.

Sensors positioned at the base of the monitor 100 for sensing various parameters of the motor 102 during operation include a motor frame temperature sensor 120, a magnetic flux sensor 124 for sensing motor flux, and a radial vibration transducer 126 for sensing motor vibrations generated by the motor 102 and transmitted through the motor frame 104. In addition to the sensors at the base of the monitor 100, an ambient temperature sensor 122 is mounted on top of a removable shelf 128 that is held in compression between the bucket 110a and lid 110b as shown. In a preferred embodiment, flux sensor 124 is a specially designed board of substantially circular dimension adhesively secured to the bottom of the bucket 110a. A metal trace deposited onto the board in a spiral pattern serves as the flux sensing element.

Although a preferred embodiment of the monitor 100 incorporates sensors within the monitor 100, it will be understood that sensors may be located external to the monitor 100 as well. For example, flux and vibration sensors may be incorporated within the motor 102, and at various locations within the motor 102. The outputs from these external sensors are interfaced with the monitor 100 by wires or by wireless means, such as infrared data link.

Outputs from sensors 122, 124, and 126 are electrically connected to an electronics board 130 where the sensor outputs are processed and stored as motor operating parameters. Two D cell batteries 144, which provide a source of dc electrical power for the monitor 100, are secured to shelf 128. Equipment that is secured to shelf 128, including batteries 144, ambient temperature sensor 122, and infrared communications port 154, are electrically connected to the electronics board 130 via a ribbon cable. Motor frame temperature sensor 120 is attached directly to the electronics board 130.

As shown in FIG. 4, the electronics board 130 is positioned immediately above the flux sensor board 124. A press nut 136 and associated hold down fitting 137 secures the electronics board 130 in place.

Additional provisions are made for the attachment of a remote temperature sensor (not shown) to the electronics board 130 for measuring, for example, internal stator temperature. Formed in the wall of the bucket 110a is a knockout section 140. To connect a remote temperature sensor to the electronics board 130, the knockout section 140 is removed and a conduit fitting is attached in its place. Electrical connection between the remote sensor and board 130 is then provided via one or more electrical conductors routed through a conduit attached to the conduit fitting. The remote temperature sensor, when used, enables the user to measure internal stator temperature so that stator temperature increase can be determined from trend data.

Outputs from all sensors are processed and stored by electronics contained on the electronics board 130. As illustrated in the functional block diagram of FIG. 3, the electronics include analog signal conditioning circuitry 141 for amplifying and frequency filtering flux and vibration signals, a microcomputer 170 programmed to control the processing and storage of sensor data, and a memory 142 for storing sensor data. In an alternate embodiment, the functions provided by the signal conditioning circuitry 141 are performed by the microcomputer 170. An electrical power source 144 provides all electrical power for the monitor 100. It will be understood that, for purposes of simplifying the block diagram illustration of FIG. 3, all connections to the power source 144 are omitted.

In operation, flux board 124 senses magnetic flux produced by the motor 102 and outputs an electrical signal corresponding to sensed flux on line 172. Flux board 124 measures motor leakage flux much like an antenna. Significant information about the motor's condition can be determined from the flux signal, including running or stopped status, motor speed and load (computed from slip), and startup acceleration time. In addition, by performing a high resolution Fourier transform of the flux signal, preferably a fast Fourier transform (FFT), one can determine voltage phase imbalance, stator turn to turn shorts, and rotor bar condition.

Motor life factors (including motor run time, motor load and cumulative run time in various load ranges, motor starts, and the time required for a starting motor to reach operating speed) are computed from the sensor signals. In addition, several motor electrical condition indicators are measured from a high resolution flux spectrum. Voltage phase imbalance, stator condition, and rotor condition are measured as relative, trendable parameters. By obtaining a measured current spectrum for the motor at full load, a calibration and severity indication of these relative values can be determined.

Motor vibrations sensed by vibration transducer 126 are converted into a corresponding electrical signal and output on line 174. Preferably, the vibration signals are transformed from the time domain to the frequency domain by the monitor 100 using Fourier transform or fast Fourier transform (FFT) to produce information corresponding to motor operating parameters. From this sensor, the monitor 100 can determine the following parameters:

1. Overall vibration;
2. Subharmonics;
3. 1×;
4. 2×;
5. High frequency in acceleration units;
6. 3×–8× synchronous energy;
7. 1×–8× nonsynchronous energy;
8. >8× synchronous energy; and
9. >8× nonsynchronous energy.

From this set of vibration parameters, mechanical faults are detected including imbalance, looseness, bearing degradation, oil instability in sleeve bearings, resonances, and others. The cumulative time the motor spends in each of three general vibration ranges (low, medium, and high) is also tracked.

The frame temperature sensor 120 outputs an electrical signal on line 176 corresponding to the temperature of the motor frame 104, and ambient temperature sensor 122 outputs an electrical signal on line 178 corresponding to ambient temperature. The difference between the two temperatures is the motor heating. The microcomputer 170 receives each of the sensor signals on lines 172–178, processes and analyzes the signals, and stores the processed signals. The monitor 100 tracks ambient temperature, motor frame temperature, and motor heating as trendable parameters, as well as the cumulative amount of time motor heat resides in three temperature ranges (low, medium, and high). Temperature profile investigations of a motor's external frame 104 shows the hottest points on a motor are midway between front and back on the side or top of the motor. Typically, open frame motors show a maximum external temperature range between 35° C. and 50° C. Totally enclosed motors typically range between 40° C. and 60° C. These temperature ranges are considered normal.

A general rule of temperature effect on motor reliability is that along term 10° C. rise in stator temperature cuts a motor's life in half. There are many factors which can cause a motor to run hot, including:

1. Over or under voltage;
2. Frequency deviation from 60 Hz;
3. Voltage imbalance;
4. Harmonic content;
5. Altitude derating;
6. High ambient temperature (>40° C.);
7. Dirty or blocked cooling passages; and
8. Excessive load.

All of these factors result in an increase in motor heating and a significant reduction in motor life.

Data is first stored within the microcomputer's internal random access memory (RAM). Data stored in RAM is then periodically transferred to an external memory device 142, such as an electrically erasable programmable read only memory (EEPROM), for longer term storage.

From the sensor outputs, many different types and formats of motor operating parameters and information can be measured and/or calculated. For example, the cumulative run time of the motor 102 can be determined and stored for the life of the motor 102. In addition, if the user wanted to know the cumulative run time of the motor 102 for the past 30 month period, that information can be determined and stored as well. Table 1 illustrates the types and formats of parameters that are determined and stored in a preferred embodiment of the invention, where leftmost column identifies various parameters that are measured, the middle column identifies the measurement period(s) for each parameter, and the rightmost column identifies the interval at which parametric measurements are acquired.

TABLE 1

| PARAMETER | MEASUREMENT | ACQUISITION INTERVAL |
|---|---|---|
| Motor Life Parameters | | |
| 1. Run time | 180 days, 60 months, life | 1 minute |
| 2. Starts | 180 days, 60 months, life | 1 minute |
| 3. Starting time | 180 days, 60 months, life | 1 minute |
| 4. Light load time 0–75% | 180 days, 60 months, life | 1 minute |
| 5. Rated load time 76–105% | 180 days, 60 months, life | 1 minute |
| 6. High load time >106% | 180 days, 60 months, life | 1 minute |
| 7. Low motor heating time | 180 days, 60 months, life | 1 minute |
| 8. Mid motor heating time | 180 days, 60 months, life | 1 minute |
| 9. High motor heating time | 180 days, 60 months, life | 1 minute |
| 10. Low vibration time | 180 days, 60 months, life | 1 minute |
| 11. Mid vibration time | 180 days, 60 months, life | 1 minute |
| 12. High vibration time | 180 days, 60 months, life | 1 minute |
| Trend Parameters | | |
| 13. Motor frame temperature | maximum, average | 1 minute |
| 14. Ambient temperature | maximum, average | 1 minute |
| 15. Motor heating (Frame-ambient) | maximum, average | 1 minute |
| 16. Motor load | maximum, average | 1 minute |

TABLE 1-continued

| PARAMETER | MEASUREMENT | ACQUISITION INTERVAL |
|---|---|---|
| 17. Voltage phase imbalance | maximum, average | 1 hour |
| 18. Stator condition | maximum, average | 1 hour |
| 19. Rotor condition | maximum, average | 1 hour |
| 20. Subharmonic vibration | maximum, average | 1 hour |
| 21. 1X vibration | maximum, average | 1 hour |
| 22. 2X vibration | maximum, average | 1 hour |
| 23. Harmonic vibration 3X–8X | maximum, average | 1 hour |
| 24. Harmonic vibration >8X | maximum, average | 1 hour |
| 25. Non-harmonic vibration 1X–8X | maximum, average | 1 hour |
| 26. Non-harmonic vibration >8X | maximum, average | 1 hour |
| 27. HFD | maximum, average | 1 hour |
| 28. Overall vibration | maximum, average | 1 hour |
| Maintenance Log Parameters | | |
| 29. Lubrication date/time | | As performed |
| 30. Alignment date/time | | As performed |
| 31. Bearing change date/time | | As performed |
| 32. Flux spectrum 1600 lines | Last 12 months (one/month) | 1 hour |
| 33. Vibration spectrum, 400 lines, 300 Hz | Last 52 weeks (one/week) | 1 hour |
| 34. Vibration spectrum, 800 lines, 2500 Hz For Variable Frequency Motors | Last 12 months (one/month) | 1 hour |
| 35. RPM cumulative time <50% max rating | 180 days, 60 months, life | 1 minute |
| 36. RPM cumulative time 50–100% max rating | 180 days, 60 months, life | 1 minute |
| 37. RPM cumulative time >100% max rating | 180 days, 60 months, life | 1 minute |
| 38. RPM | maximum, average | 1 minute |

Table 1 is divided into four categories of parameters—motor life, trend, maintenance, and variable frequency motor parameters. Each parameter is measured frequently and stored in a daily and monthly buffer. The maximum and average levels for certain parameters are stored daily and kept for 180 days in a circular buffer. Each average and maximum parameter value is stored monthly in the EEPROM 142 and saved for 60 months (5 years). Some parameters are stored as the cumulative value over defined intervals, including intervals of 180 days, 60 months, and lifetime.

For example, for the motor life parameters (parameters 1–12), the cumulative value of each parameter is stored for the last 180 days, the last 60 months, and life. For trend parameters (parameters 13–28), each parameter is stored once per day for the last 180 day period and once per month for the last 60 month period.

In the circular data buffers, as new data is acquired, the oldest data in the cycle is deleted. For example, in the circular buffer for "motor frame temperature", when the data for the 61st month is acquired, it overwrites the data for the first month. Therefore, to maintain a complete historical record of this parameter, data relating to motor frame temperature should be downloaded from the monitor 100 and placed in long term electronic storage at least once every 60 months.

As Table 1 indicates, information pertaining to motor maintenance may be input and stored in the monitor 100. A record of all maintenance activity on the motor 102 can be entered through an external device, such as a CSI™ 2110 data collector, and stored in the monitor 100. Maintenance information includes the time and date lubrication, machine alignment, and bearing replacements.

Data and information is transmitted to and from the monitor 100 through a communications port 154 (FIGS. 4 and 5), which is preferably a serial infrared (IR) data link. The lid 110b is fabricated from an IR transmissible material, such as a polycarbonate material, so that communications port 154 can be protected within the monitor's housing 110. Communications port 154 provides an interface for communicating with an external device, such as a portable data collector or notebook computer, via infrared data link to enable the history information to be downloaded. The portable data collector or notebook computer may also be used to program, or download programs to, the monitor 100. For the parameters given in Table 1, data would need to be downloaded at least every 180 days to avoid loss of any data. In other applications, the circular data buffers may be designed with longer or shorter circular lives. The downloaded information can be further analyzed to provide an indication of the remaining useful life of the motor 102 and to diagnose problems.

At least two options are available for collecting stored data. In one option, a portable data collector is used as a data gatherer only, with no data display capability. The data is simply moved from the monitor 100 to a base computer for analysis and archival. Another option for data collection utilizes a full Windows™ compatible pad computer running the necessary data analysis software. The pad computer should be rugged enough to analyze and display motor parametric data in the field.

In a preferred embodiment, all electrical power for the monitor 100 is provided by one or more dc batteries 144, such as two replaceable, D cell, Alkaline batteries 144 as previously discussed with respect to FIG. 4. Power consumption is kept to a minimum in the interest of prolonging battery life to at least two years. Microcomputer 170, which in a preferred embodiment is an 8-bit microcomputer manufactured by Toshiba, minimizes power consumption by employing a power saving sleep mode where the microcomputer 170 remains idle, or sleeps most of the time. The microcomputer 170, which includes a clock for maintaining time and date and for measuring elapsed time for certain parameters, awakes periodically, such as every 5 seconds, and checks the motor ON/OFF status. If the motor 120 is ON, the monitor 100 checks the overall amplitude measurements (load, temperature, and vibration) every 2 minutes, all measurements derived from FFT calculations once per hour, and starts per day are counted. If the motor 102 is OFF, no data is stored and the monitor 100 is set to capture the acceleration time upon start-up.

Other sources of electrical power suitable for use within the monitor 100 are available. For example, the D cell Alkaline batteries of the preferred embodiment could be replaced with a Peltier device. This type of device includes a material which, when heated on one side and cooled on the other, produces electrical power. The larger the temperature differential, the more power that the device is able to produce. The Peltier device would take advantage of motor heat to elevate the temperature of the hot side of the device, while ambient cooling would be used to reduce the temperature of the cold side. As another alternate source of power, a 120 volt powerline can be connected to the monitor 100.

During operation of an electric motor 102, heat generated by the motor is typically transferred by the motor frame 104 to the ambient air, creating a heat blanket that surrounds the motor frame 104. A heat blanket may also result from external factors, such as heating induced by absorption of sunlight. Under certain conditions with some motors, this heat blanket can be large enough to adversely effect the accuracy of the ambient temperature sensor 122 and significantly reduce battery life. Heat generated by the motor and external factors is also conducted from the frame 104 and surrounding ambient air to the monitor 100.

To reduce adverse effects of elevated temperature on temperature sensitive equipment such as the ambient temperature sensor 122 and batteries 144, such equipment is preferably located on shelf 128 shown in FIG. 4. As seen in FIG. 4, shelf 128 is elevated by the bucket 110a so that equipment located on the shelf 128 is largely if not totally removed from the motor's heat blanket. The bucket 110a itself, being fabricated from a low thermally conductive material, also functions in a lesser capacity to shield convective heat from the ambient temperature sensor 122 and batteries 144.

As discussed above, life history parameters are stored in memory 142 where they can be accessed and downloaded via communications port 154. To determine these parameters, microcomputer 170 utilizes signals generated by the sensors 120–126. Some of the sensor signals are utilized by the microcomputer 170 with little or no conditioning of the signals, while other sensor signals receive some amount of conditioning by the signal conditioning circuitry 141, including amplification and frequency filtering, before microcomputer 170 uses them. For example, to determine "run time", the output of flux board 124 may be used directly by microcomputer 170 as an indication that the motor 102 is operating. To ensure the flux signal has sufficient strength, it is first amplified and frequency filtered as needed by the signal conditioning circuitry 141 before it is received by the microcomputer 170. The microcomputer's internal clock is used to maintain a count of the total hours during which magnetic leakage flux is being generated by the motor 102. In this manner, the life history parameter of "run time" shown in Table 1 is determined. Alternatively, the outputs of frame temperature sensor 120 and accelerometer 126 may be utilized as indications of when the motor 102 is operating.

As other examples of life history parameters that are determined directly from sensor outputs, consider the parameter of "maximum motor frame temperature". To determine this parameter, microcomputer 170 compares the current frame temperature sensor output on line 176 to the previous maximum frame temperature. The stored maximum frame temperature is replaced by the current frame temperature when the current frame temperature exceeds the stored maximum. Similarly, the parameter labeled "starts" is determined directly from measured flux, or if preferred, it may be determined by monitoring temperature and vibration. When both exceed a selected threshold, a "running" condition is assumed. When either falls below its threshold, a "stopped" condition is assumed.

To determine the three "motor heating time" parameters, microcomputer 170 subtracts ambient temperature from the frame temperature to arrive at a motor heating temperature. Total motor run time at each of the low, mid, and high heating levels identified in Table 1 is then determined from the microcomputer's internal clock.

The analog output of flux board 124 is received from line 172 and amplified before being used by the microcomputer 170. As previously stated, microcomputer 170 uses a signal representative of magnetic flux produced by the motor 102 to ascertain when the motor 102 is operating. The analog output of vibration transducer 126, which represents vibration in the acceleration domain, is received by the signal conditioning circuitry 141 from line 174 where the vibration signal is preferably amplified, frequency filtered, and integrated. The conditioned vibration signal is then provided to microcomputer 170 for storage and/or analysis. For example, in a preferred embodiment the microcomputer 170 is programmed to transform sensor signals such as vibration and flux from the time domain to the frequency domain by means of a Fourier transform or a fast Fourier transform, producing spectral data. Integration of the vibration signal to the velocity domain may also be performed by the microcomputer 170.

Following an analog-to-digital conversion, the velocity domain vibration signal is used by the microcomputer 170 to determine the various vibration parameters identified in Table 1 . Preferably, the "maximum vibration" is the maximum vibration measured in velocity units, but alternately, velocity may be integrated to obtain vibration measured in displacement units and the maximum displacement is, in this alternate embodiment, stored as the "maximum vibration". Motor speed can be determined from a Fourier transform, preferably a high resolution FFT of the digitized vibration signal. Preferred methods of determining motor speed from vibration spectral data are disclosed in U.S. Pat. No. 5,744,723 and entitled METHOD FOR DETERMINING ROTATIONAL SPEED FROM MACHINE VIBRATION DATA, the entire contents of which are expressly incorporated herein by reference. The difference between actual speed and synchronous speed at no load is used to determine motor load.

During initial installation and setup of the monitor 100, the monitor 100 is setup for the particular motor 102 on which it is installed. During this installation mode, a peripheral device such as a notebook computer or portable data collector is connected to the monitor 100 via the communications port 154 for programming, or training. Various settings and adjustments are made to the monitor 100 during setup, including full load speed, number of poles, motor identification, and others.

Once installation and training are completed, operation of the monitor 100 is completely self-contained and maintenance-free. As previously described, the monitor's internal battery 144 and electronics are configured to operate for at least two years before battery power is depleted. Data stored in the memory 142 should be periodically downloaded, at least once every six months, and analyzed to determine the health and operating condition of the motor 102. When life-extending maintenance is performed on the motor 102, that maintenance information should be input to the monitor 100.

Figure 6:
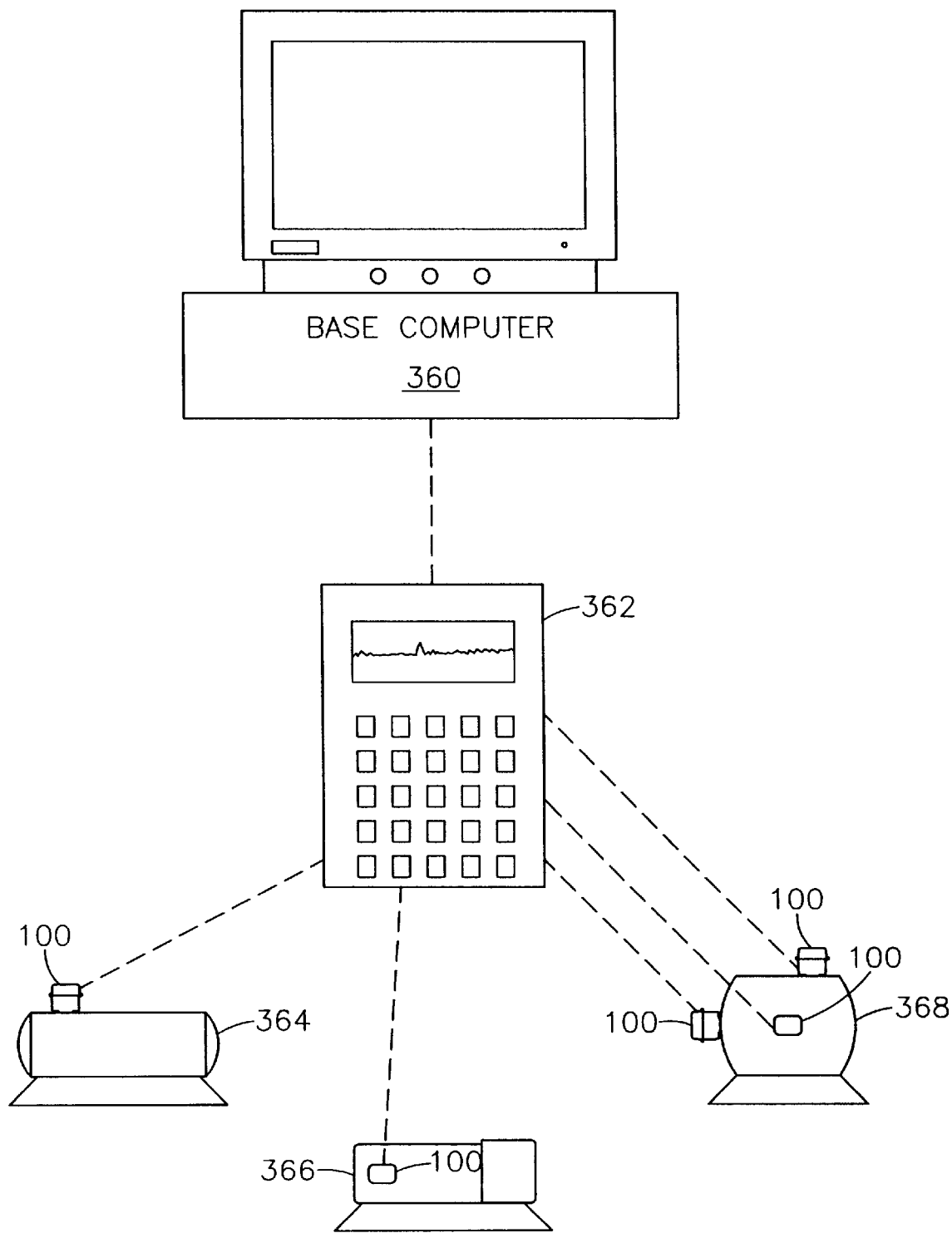
FIG. 6 is a diagrammatic drawing illustrating a monitoring system that employs a portable data collector to periodically download data stored by various monitors and transfer the downloaded data to a base computer for processing and analysis.

In a typical industrial facility, tens or even hundreds of electrical machines may exist. As FIG. 6 illustrates, the present invention provides plant personnel with a convenient system for monitoring each machine. Illustrated in FIG. 6 are three electric motors 364, 366, and 368 onto which monitors 100 have been attached. A portable data collector 362, such as a CSI™ 2120 data collector, is used to periodically download data stored in each of the monitors' memory 142. After all downloading of data is completed, the collected data is transferred to a base computer 360 for analysis and archival. Alternatively, the data collector 362 may be programmed to analyze the downloaded data on site to provide a quick determination of the operating condition of a particular motor. As described previously herein, a further function of the data collector 362 is to program, or download programs from, the monitors 100.

Figure 7:
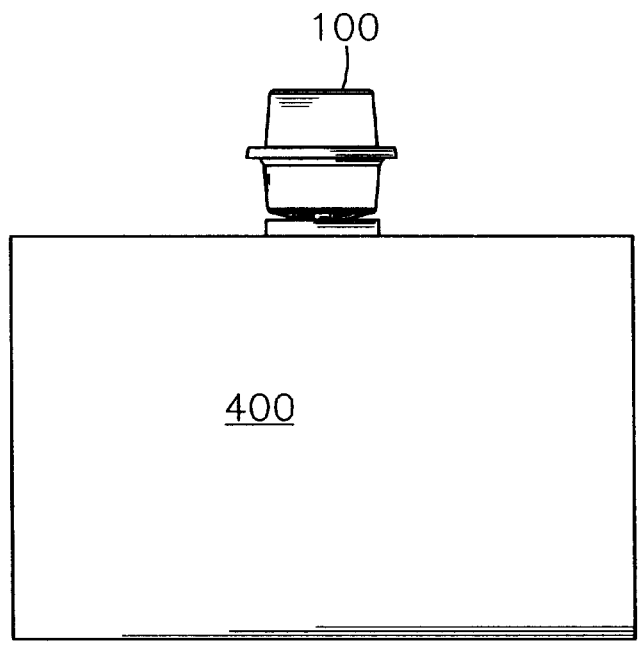
FIG. 7 is a side view showing a monitor of the present invention attached to a pump.

For machines other than electric motors, the monitor 100 may be configured slightly differently than described above since the specific factors which affect the life of a machine may vary based on the type of machine that is being monitored. For example, as shown in FIG. 7, the monitor 100 is attached to a pump 400 to monitor the pump's operating condition. Depending on the type and amount of data that is desired, a single sensor or a plurality of sensors may be employed to monitor the pump's operating condition. Since a high percentage of potential faults within the pump 400 are detectable from vibration, a preferred embodiment of the monitor 100 of FIG. 7 includes a single vibration sensor with no flux or temperature sensors. Vibration produced by the pump 400 is sensed by the monitor 100 and processed, recorded, and/or analyzed as described above to ascertain the health and condition of the pump.

Figure 8:
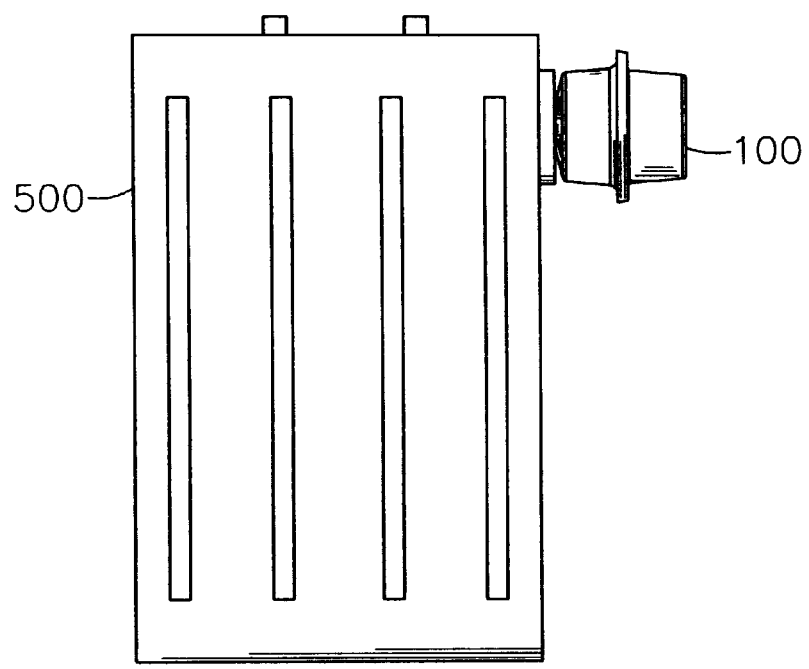
FIG. 8 is a side view showing a monitor of the present invention attached to a transformer.

As shown in FIG. 8, the monitor 100 can be employed to monitor the operating condition of a transformer 500 by attaching the monitor 100 on or near the transformer 500. Flux produced by the transformer 500 can be sensed by the monitor 100 and analyzed to ascertain many faults which are typically experienced by transformers. Vibration and temperature generated by the transformer also provide useful information for ascertaining the condition of the transformer 500. Accordingly, to determine the operating condition of the transformer 500, the monitor 100 of FIG. 8 may include only a single sensor. If additional data is desired, the monitor 100 may be configured to include additional sensors as needed.

Figure 9:
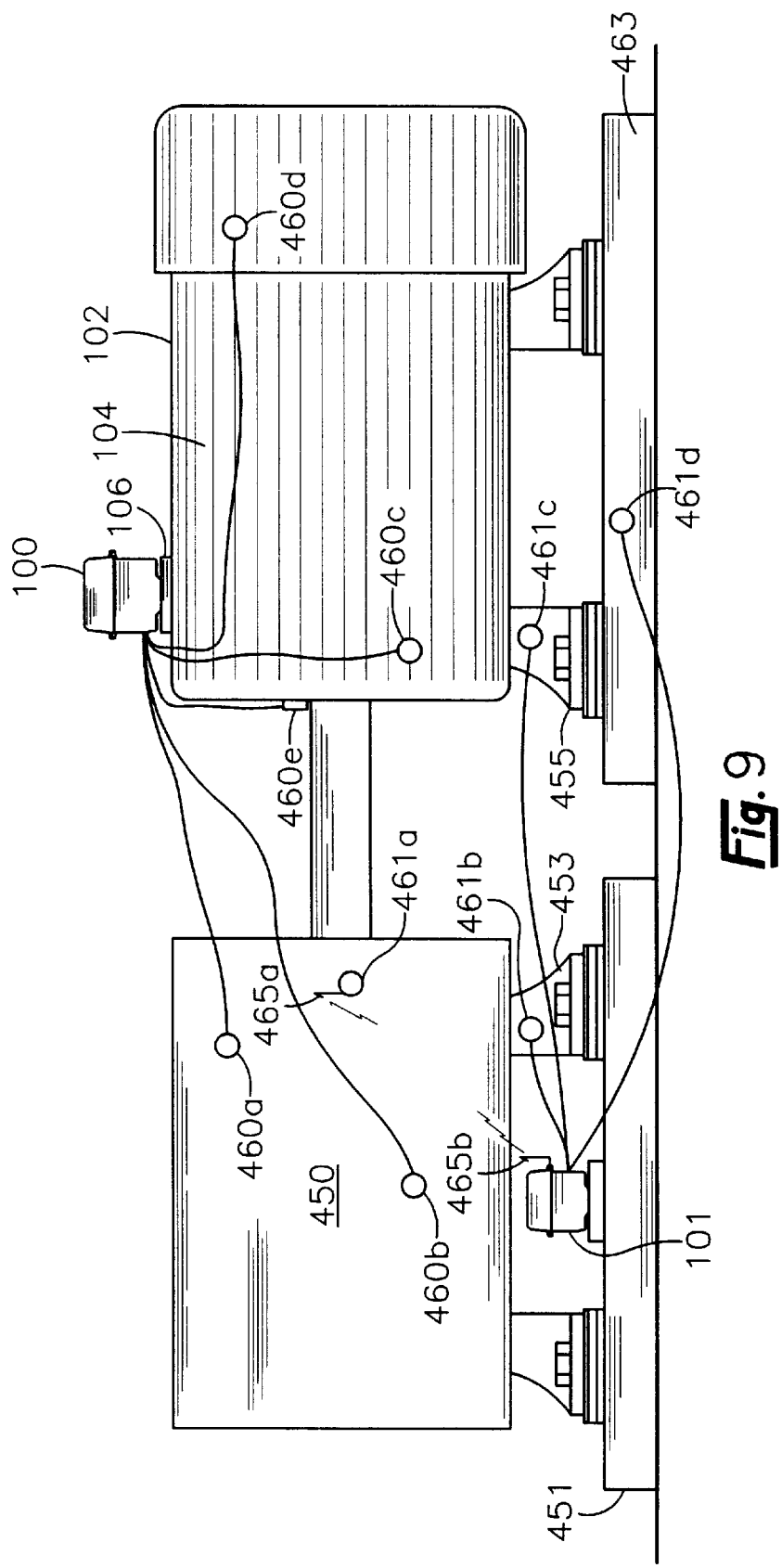
FIG. 9 is a side view of a monitor of the present invention attached to a motor driving a piece of driven equipment with tethered sensors positioned on the motor and the driven equipment.

As FIG. 9 illustrates, the monitor's capabilities may be extended by tethering one or more external sensors (shown generally at 460*a–d*) to the monitor 100. In general, tethered sensors 460*a–d* may include one or more sensors 460*c*, 460*d* for sensing motor operating parameters, one or more sensors 460*a*, 460*b* for sensing operating parameters of the driven equipment 450, or sensors 460*a–d* for sensing operating parameters of both the motor 102 and the driven equipment 450. The tethered sensors 460*a–d*, which may include sensors for sensing machine operating parameters such as vibration (radial, horizontal, vertical, and other variations), temperature, flux, and the like, are preferably tethered to the monitor 100 by cables. Alternatively, the external sensors 460*a–d* are tethered by wireless means such as radio frequency (RF) data link 464*a–b*.

The type of sensors chosen to monitor the driven equipment 450 will, of course, depend in part on the type of equipment being driven by the motor 102. For example, if the driven equipment 450 is of a type which does not produce flux, then a flux sensor is not needed to monitor the driven equipment 450.

A specific form of flux sensor which may be tethered to the monitor 100 is a tri-axial sensor which produces sensor signals representing three axes of flux data. A preferred vibration sensor is a piezoelectric sensing device similar to or the same as that described in pending U.S. patent application Ser. No. 08/841,003, filed Apr. 22, 1997, and entitled "System and Method Using a Piezoelectric Device for Detecting Vibration Signals". Another type of tethered sensor which may be employed in the practice of the invention is a tachometer 460*e* or other type of movement sensor for sensing movement representing the speed of a rotating machine element, such as the motor drive shaft 470.

There are typically several measurement points along the motor 102 and driven equipment 450 which provide a data rich environment for sensor placement. As with data obtained from sensors that are internal to the monitor 100, the additional data obtained from the tethered sensors 460*a–e* is stored by the monitor 100 to provide an operating history of the motor 102, or the driven equipment 450, or both. Also, as previously described with regard to sensors positioned internal to the monitor 100, sensor signals produced by tethered sensors 460*a–e* may be processed by the monitor electronics by transforming the sensor signals to the frequency domain by FFT. The resulting spectral data is then analyzed by the monitor 100 for fault conditions, stored in the monitor's memory 142, or both. Use of tethered sensors in accordance with the invention enables the monitor 100 to collect data from these points and thereby increase the likelihood of identifying anomalous machine operating conditions. Thus, the tethered sensors 460*a–e* provide an additional monitoring capability that is complementary to monitoring that is achieved by internal sensors contained in the monitor 100.

Although the tethered sensors 460*a–e* are each shown in FIG. 9 as being attached to the outer surface of the motor and driven equipment 450, it will be understood that sensors may also be positioned internal to the motor 102 and driven equipment 450 and tethered to the monitor 100. For example, many electric motors are now manufactured with a resistance temperature detector (RTD) wound in with the stator wires. The RTD lead, which is typically accessible by means of a connection port 558 at the motor junction box 550 (FIG. 10), may be tethered to the monitor 100 by connection of the monitor 100 to port 558, as further described below. Data provided by the RTD is used by the monitor 100 to provide a temperature history of the motor windings. The temperature history can then be analyzed to detect and monitor anomalous motor operating conditions resulting from overheating of the windings (such as winding insulation degradation). It will also be understood that the monitor 100 may be attached to a mount proximate the driven equipment 450 rather than the motor as shown in FIG. 9, with tethered sensors provided for sensing operating parameters of the driven equipment 450 only, the motor only, or both the driven equipment 450 and the motor 102.

Use of tethered sensors 460*a–e* in conjunction with the monitor 100 enables the monitor 100 to provide more complete data coverage than is possible when using only sensors that are internal to the monitor 100. The tethered sensors 460*a–e* may be strategically placed at the most data rich points of the machine, and they enable condition monitoring of both the motor 102 and its driven equipment 450.

Monitor 101 is mounted below the driven equipment 450 on a mounting plate 451. This positioning illustrates an alternate embodiment in which the monitor 101 is mounted proximate, but not on a machine. Monitor 101 senses vibration in plate 451 and ambient air temperature. Through sensors 461*a–d*, monitor 101 senses, respectively, horizontal vibration of the driven equipment 450, vibration of mounting feet 453 and 455, and vibration of mounting plate 463. Positioning of the monitor 101 still allows for monitoring machine conditions with an emphasis on machine conditions relating to the integrity of mounting structure, such as mounting plates 451 and 463, and support feet 453 and 455. In this embodiment, sensor 461*a* is shown tethered to monitor 101 by an RF data link 465*a–b*.

Figure 10:
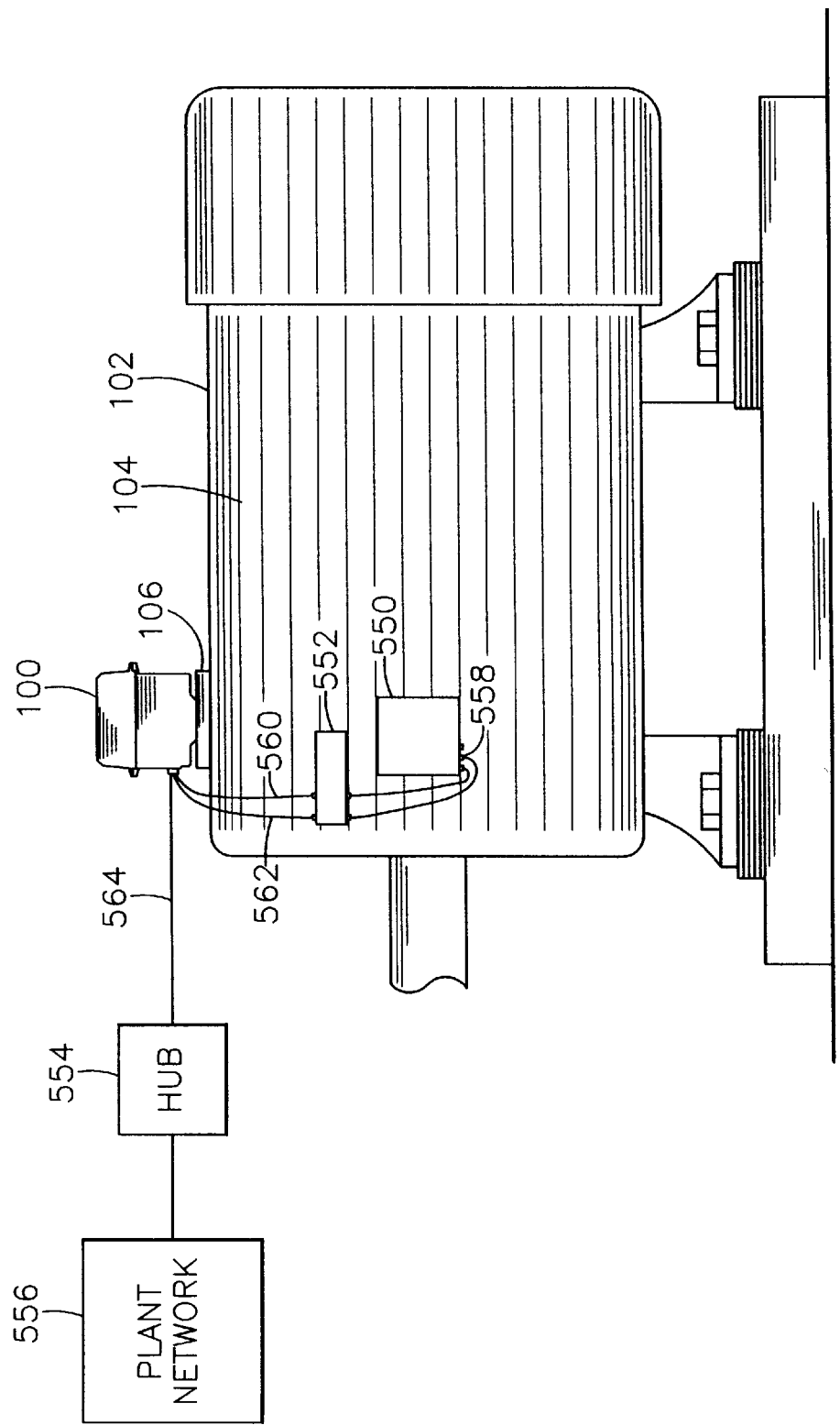
FIG. 10 is a side view of a monitor in accordance with the invention attached to a motor with the monitor being connected to the motor junction box to receive electrical power and to receive the output of the motor RTD, and also being connected for communication with a computer network.
Figure 11:
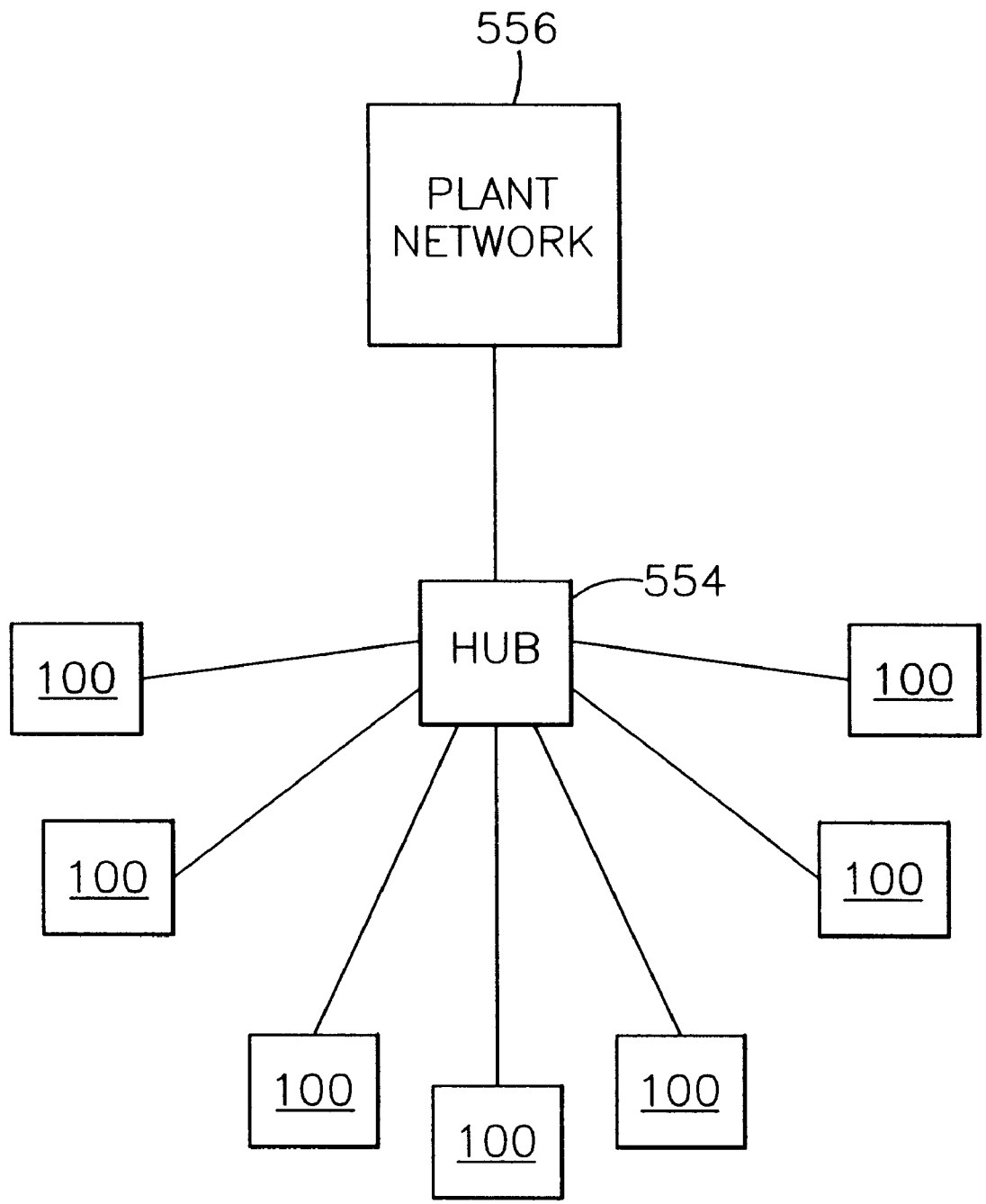
FIG. 11 is a diagrammatic drawing showing a monitoring system in which several monitors of the present invention are interfaced with a computer network by way of a central hub.

FIG. 10 is illustrative of the versatility of a monitor 100 in accordance with the invention. As shown in FIG. 10, the monitor 100 may be configured to receive electrical power on line 562 from the motor's junction box 550, to receive RTD temperature data on line 560, and to interface with a plant computer network 556 on line 564. In addition to the tethered internal motor RTD, external sensors may be tethered to the monitor 100 of FIG. 10 in substantially the same manner as shown in FIG. 9. Of course, any combination of internal and external sensors may be tethered to the monitor 100.

In a preferred embodiment, a terminal strip 552 is used to interconnect lines 560 and 562 to the junction box 550. Receipt of RTD data on line 560 enables monitoring of motor winding temperature as discussed above, and receipt of electrical power on line 562 enables the monitor 100 to function for extended periods of time at higher power levels without concern for depletion of the power source.

With continued reference to FIG. 10, in a preferred embodiment the monitor 100 is interfaced with the plant network 556 by a communications hub 554. A total of 31 monitors 100 can be connected to the communications hub. Preferably, line 564 is an RS485 communications link and communications port 154 (FIG. 5) is an RS485 communications module.

Interfacing the monitor 100 with the plant network 556 gives machine operators the option to continuously monitor the condition of the motor 120 on-line, or to download stored data when desired. Thus, with the monitor 100 connected to the plant network 556, downloading stored data is greatly simplified and no longer requires manual collection in accordance with a predetermined route. Programming of the monitor 100 can also be accomplished on-line from the plant network 556. When the monitor 100 detects an alarm condition, data is sent over line 564 to the plant network 556 to inform machine operators of the alarm condition. If desired, the plant network 556 may be configured to automatically shut down the motor 102 when an alarm condition is announced by the monitor 100.

It is contemplated, and will be apparent to those skilled in the art from the foregoing specification, drawings, and examples that modifications, substitutions, and/or changes may be made in the embodiments of the invention. Accordingly, it is expressly intended that the foregoing are illustrative of preferred embodiments only, not limited thereto, and that the true spirit and scope of the present invention be determined by reference to the appended claims.

What is claimed is:

1. A monitor that attaches to a mount proximate an electric motor which drives a piece of driven equipment, said monitor for monitoring operation of the motor or the driven equipment, or both, and producing an operation history which includes one or more machine operating parameters, said monitor comprising:

a structural enclosure;

an engagement surface formed on said enclosure;

a fastener for attaching said engagement surface to the mount;

a power supply for supplying electrical power to the monitor;

at least one internal sensor disposed in said structural enclosure for sensing one or more internally sensed operating parameters of the motor and producing internal sensor signals corresponding to the one or more internally sensed operating parameters;

at least one external sensor disposed external to said structural enclosure for sensing one or more externally sensed operating parameters of the motor or the driven equipment, or both, and producing external sensor signals corresponding to the one or more externally sensed operating parameters;

a signal processor disposed in said enclosure for receiving and processing internal and external sensor signals to produce data corresponding to the sensed operating parameters;

memory disposed in said enclosure for storing data corresponding to the sensed operating parameters; and a communications port for communicating with a peripheral device.

2. The monitor of claim 1 wherein said signal processor is operational to perform a Fourier transform of at least one of said internal and external sensor signals to produce data corresponding to the sensed operating parameters.

3. The monitor of claim 1 wherein said operating parameters are selected from a group consisting of motor speed which is determined by the signal processor, machine load which is determined by the signal processor, cumulative time of machine operation for different categories of loads, and total number of motor starts.

4. The monitor of claim 1 wherein said power supply includes a battery disposed in said structural enclosure.

5. The monitor of claim 1 wherein said power supply comprises a power supply circuit disposed in said enclosure for electrical connection to an external source of power.

6. The monitor of claim 1 wherein said at least one internal sensor is selected from a group consisting of a vibration transducer, a flux sensor, and a temperature sensor.

7. The monitor of claim 1 wherein said at least one external sensor is selected from a group consisting of a vibration transducer, a flux sensor, and a temperature sensor.

8. The monitor of claim 1 wherein said communications port includes a wireless communications port.

9. The monitor of claim 1 wherein said communications port includes a communications module for communicating with a computer network.

10. The monitor of claim 1 wherein at least one external sensor is disposed on said motor.

11. The monitor of claim 1 wherein at least one external sensor is disposed on said driven equipment.

12. The monitor of claim 1 wherein one or more external sensors are disposed on said motor and one or more external sensors are disposed on said driven equipment.

13. A monitor that attaches to a mount on or proximate a piece of driven equipment which is driven by an electric motor, said monitor for monitoring operation of the motor or the driven equipment, or both, and producing an operation history which includes one or more machine operating parameters, said monitor comprising:

a structural enclosure;

an engagement surface formed on said enclosure;

a fastener for attaching said engagement surface to the mount;

a power supply for supplying electrical power to the monitor;

at least one internal sensor disposed in said structural enclosure for sensing one or more internally sensed operating parameters of the driven equipment and producing internal sensor signals corresponding to the one or more internally sensed operating parameters;

at least one external sensor disposed external to said structural enclosure for sensing one or more externally sensed operating parameters of the motor or the driven equipment, or both, and producing external sensor signals corresponding to the one or more externally sensed operating parameters;

a signal processor disposed in said enclosure for receiving and processing internal and external sensor signals to produce data corresponding to the sensed operating parameters;

memory disposed in said enclosure for storing data corresponding to the sensed operating parameters; and a communications port for communicating with a peripheral device.

14. The monitor of claim 13 wherein said signal processor is operational to perform a fast Fourier transform of at least one of said external and internal sensor signals to produce data corresponding to the sensed operating parameters.

15. The monitor of claim 13 wherein said communications port includes a communications module for communicating with a computer network.

16. The monitor of claim 13 wherein at least one external sensor is disposed on said driven equipment.

17. The monitor of claim 13 wherein at least one external sensor is disposed on said motor.

18. The monitor of claim 13 wherein one or more external sensors are disposed on said driven equipment and one or more external sensors are disposed on said motor.

19. A system for monitoring the condition of one or more machines, the system comprising:

for each of said one or more machines, at least one monitor attached to the machine for sensing and storing at least one operating parameter of the machine, the at least one stored parameter corresponding to the operation history of the machine; and a computer network connected to each monitor for downloading the stored operation history of each machine.

20. The monitoring system of claim 19 wherein each monitor attaches to a mount proximate a machine and includes:

a structural enclosure;

an engagement surface formed on said enclosure;

a fastener for attaching said engagement surface to the mount;

a power supply for supplying electrical power to the monitor;

at least one internal sensor disposed in said structural enclosure for sensing one or more internally sensed operating parameters of the machine and producing internal sensor signals corresponding to the one or more internally sensed operating parameters;

a signal processor disposed in said enclosure for receiving and processing sensor signals to produce data corresponding to the sensed operating parameters;

memory disposed in said enclosure for storing data corresponding to the sensed operating parameters; and a communications module for communicating with the computer network.

21. The monitoring system of claim 20, further comprising a communications hub attached to each monitor for controlling communication between each monitor and the computer network.

22. The monitoring system of claim 20, further comprising at least one external sensor disposed external to said structural enclosure for sensing one or more externally sensed operating parameters of the machine and producing external sensor signals corresponding to the one or more externally sensed operating parameters.

23. A method of monitoring one or more machines which generate machine operating parameters, comprising the steps of:

attaching a machine monitor adjacent said one or more machines;

producing sensor signals with said monitor representing a machine operating parameter generated by the machine;

processing the sensor signals with said monitor over time to produce a life history of said operating parameter for the machine;

storing said life history in said monitor; and transferring the life history of the machine to a computer network connected to the monitor.

24. The method of claim 23 wherein said producing step includes producing sensor signals with a machine sensor disposed in the monitor.

25. The method of claim 23 wherein said producing step includes producing sensor signals with a machine sensor disposed external to said monitor.

* * * * *